(12) United States Patent
Chun et al.

(10) Patent No.: US 11,956,982 B2
(45) Date of Patent: Apr. 9, 2024

(54) ORGANIC LIGHT-EMITTING DEVICE

(71) Applicant: LG CHEM, LTD., Seoul (KR)

(72) Inventors: Minseung Chun, Daejeon (KR); Seong So Kim, Daejeon (KR); Jae Seung Ha, Daejeon (KR)

(73) Assignee: LG CHEM, LTD., Seoul (KR)

( * ) Notice: Subject to any disclaimer, the term of this patent is extended or adjusted under 35 U.S.C. 154(b) by 745 days.

(21) Appl. No.: 17/046,055

(22) PCT Filed: Jun. 25, 2019

(86) PCT No.: PCT/KR2019/007644
§ 371 (c)(1),
(2) Date: Oct. 8, 2020

(87) PCT Pub. No.: WO2020/017772
PCT Pub. Date: Jan. 23, 2020

(65) Prior Publication Data
US 2021/0175455 A1   Jun. 10, 2021

(30) Foreign Application Priority Data
Jul. 19, 2018   (KR) .......................... 10-2018-0084113

(51) Int. Cl.
*H10K 50/19*   (2023.01)
*H10K 50/11*   (2023.01)
(Continued)

(52) U.S. Cl.
CPC ............ *H10K 50/19* (2023.02); *H10K 50/11* (2023.02); *H10K 85/342* (2023.02); *H10K 85/40* (2023.02);
(Continued)

(58) Field of Classification Search
None
See application file for complete search history.

(56) References Cited

U.S. PATENT DOCUMENTS

2009/0174315 A1   7/2009   Furukawa et al.
2011/0133226 A1   6/2011   Lee et al.
(Continued)

FOREIGN PATENT DOCUMENTS

KR   10-2008-0095244   10/2008
KR   10-2011-0063087   6/2011
(Continued)

OTHER PUBLICATIONS

Machine-generated English translation of KR1020170045512, total pp. 29 (Year: 2017).*

*Primary Examiner* — Bo B Jang
(74) *Attorney, Agent, or Firm* — BRYAN CAVE LEIGHTON PAISNER LLP

(57) ABSTRACT

Provided is an organic light-emitting device including: an anode; a cathode facing the anode; two or more light-emitting layers provided between the anode and the cathode and each having a maximum light emission peak of ≤500 nm (≤500 nm emission layer); and a light-emitting layer provided between the two or more ≤500 nm emission layers, and having a maximum light emission peak at >500 nm (>500 nm emission layer), where a distance from the anode to the ≤500 nm emission layer most adjacent to the anode is 100 nm to 200 nm, the distance from the anode to the ≤500 nm emission most adjacent to the cathode is three to four times the distance from the anode to the ≤500 nm emission layer most adjacent to the anode, and an N-type charge generation layer including an alkali metal and a P-type charge generation layer including a material with an electron affinity of ≥4.8 eV are provided between each of the ≤500 nm emission layers and the emission >500 nm emission layer.

12 Claims, 5 Drawing Sheets

(51) Int. Cl.
*H10K 85/30* (2023.01)
*H10K 85/40* (2023.01)
*H10K 85/60* (2023.01)
*H10K 102/00* (2023.01)

(52) U.S. Cl.
CPC .......... *H10K 85/60* (2023.02); *H10K 85/615* (2023.02); *H10K 85/622* (2023.02); *H10K 85/626* (2023.02); *H10K 85/633* (2023.02); *H10K 85/636* (2023.02); *H10K 85/654* (2023.02); *H10K 85/6572* (2023.02); *H10K 85/6574* (2023.02); *H10K 2102/351* (2023.02)

(56) References Cited

U.S. PATENT DOCUMENTS

| | | |
|---|---|---|
| 2011/0133227 A1 | 6/2011 | Lee et al. |
| 2015/0076451 A1 | 3/2015 | Dobbertin et al. |
| 2015/0188073 A1 | 7/2015 | Ahn et al. |
| 2015/0188087 A1 | 7/2015 | Lee |
| 2016/0164042 A1 | 6/2016 | Cho et al. |
| 2017/0155055 A1 | 6/2017 | Joo et al. |
| 2017/0194387 A1 | 7/2017 | Oh et al. |
| 2018/0062103 A1 | 3/2018 | Kim et al. |
| 2018/0090686 A1 | 3/2018 | Yoon et al. |

FOREIGN PATENT DOCUMENTS

| | | |
|---|---|---|
| KR | 10-2011-0063090 | 6/2011 |
| KR | 10-2014-0095487 | 8/2014 |
| KR | 10-2015-0075674 | 7/2015 |
| KR | 10-2015-0078570 | 7/2015 |
| KR | 10-2015-0080407 | 7/2015 |
| KR | 10-2016-0069468 | 6/2016 |
| KR | 10-2016-0150185 | 12/2016 |
| KR | 10-2017-0045512 | 4/2017 |
| KR | 10-2017-0065727 | 6/2017 |
| KR | 10-2017-0080923 | 7/2017 |
| KR | 10-2018-0024710 | 3/2018 |
| KR | 10-2018-0035358 | 4/2018 |

* cited by examiner

[Figure 1]
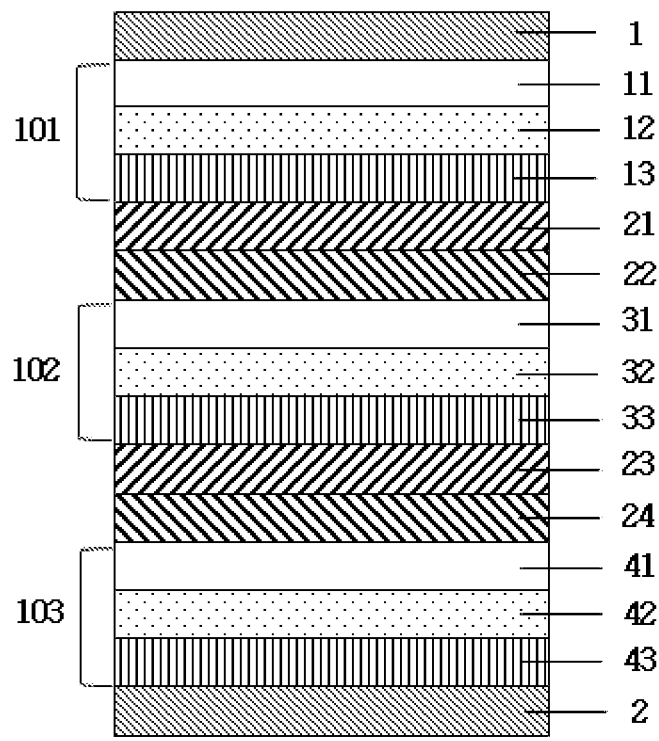
[Figure 2]
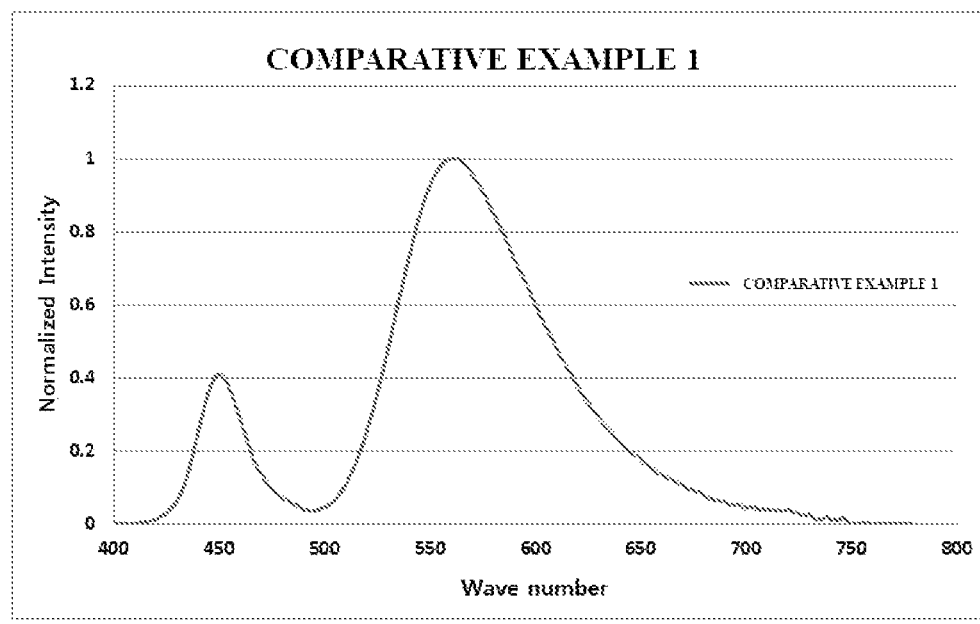

[Figure 3]
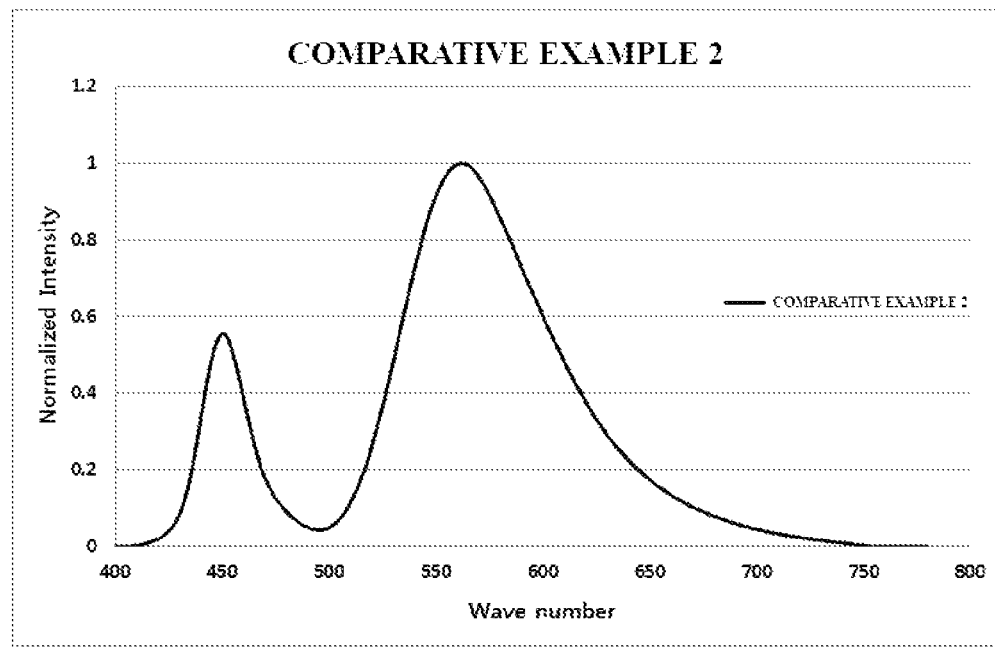
[Figure 4]
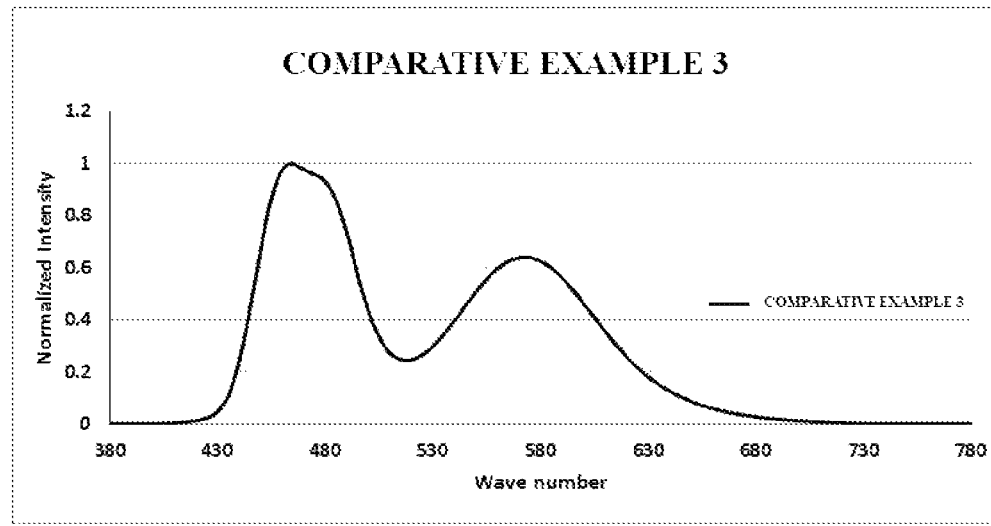

[Figure 5]
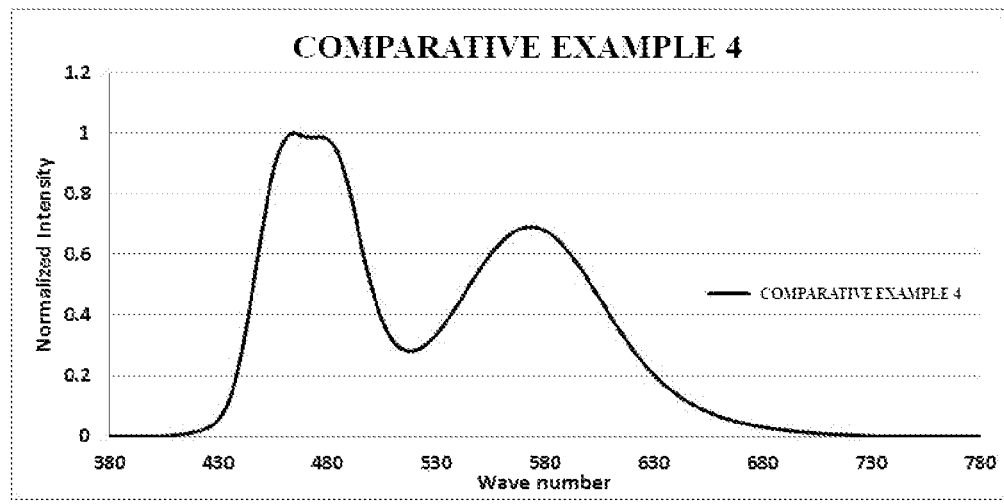
[Figure 6]
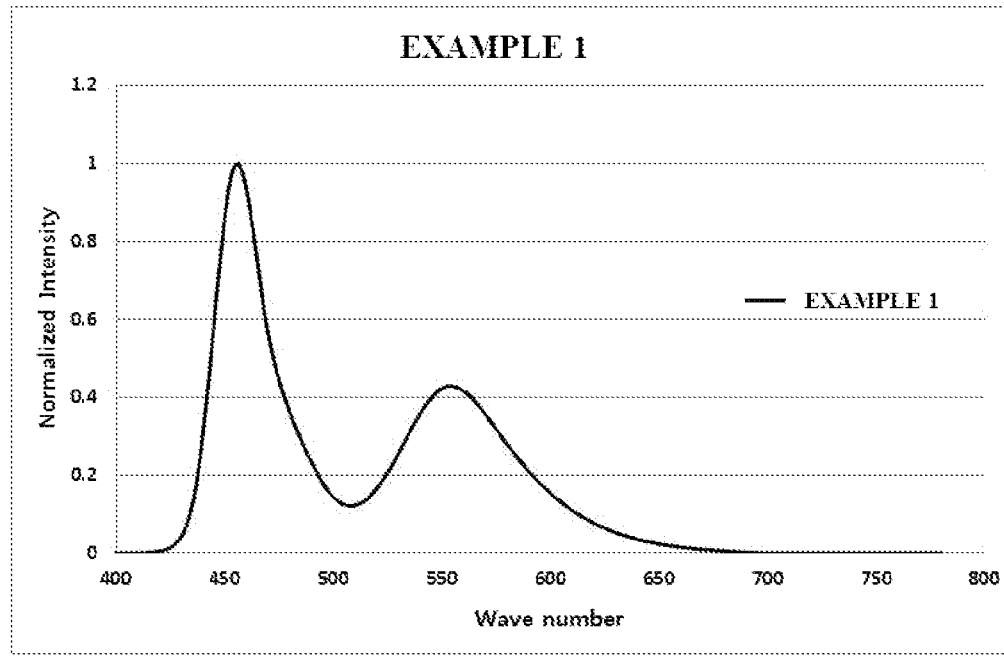

[Figure 7]
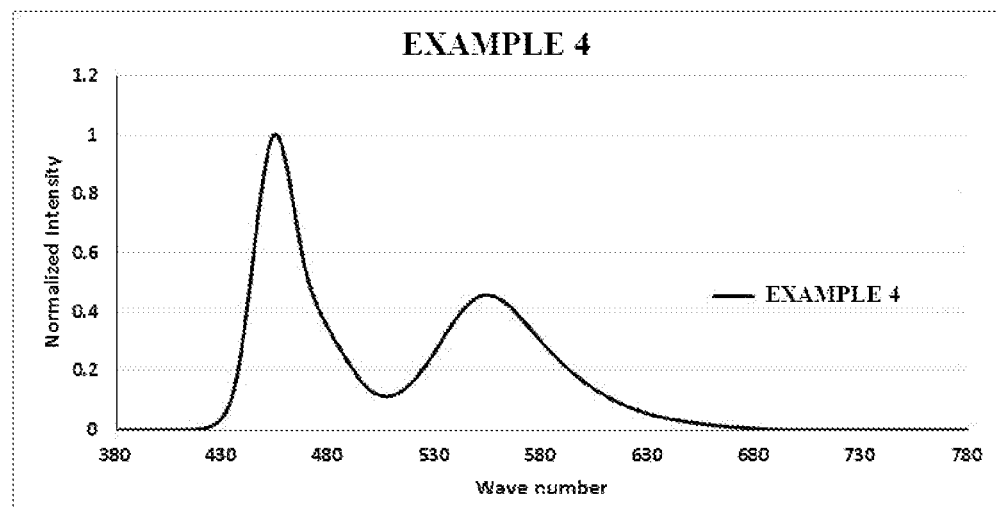
[Figure 8]
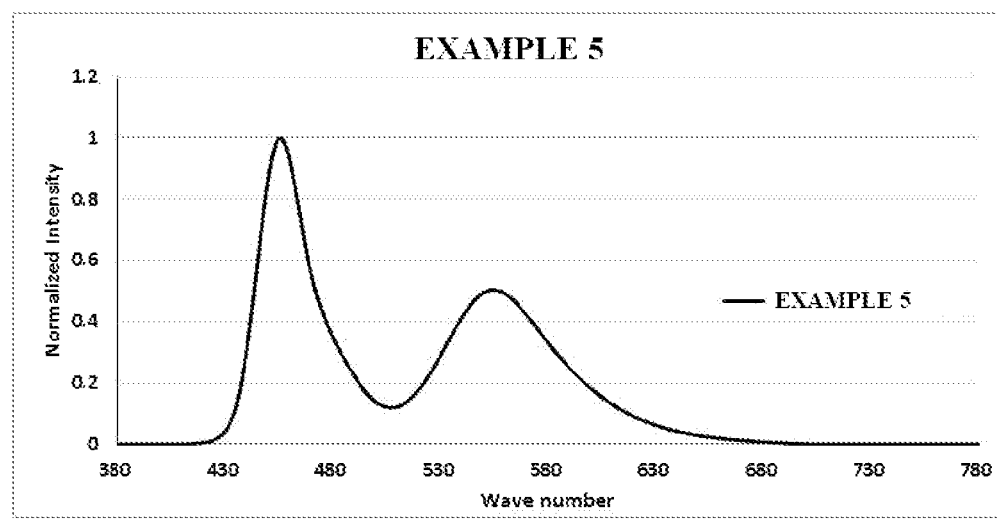

[Figure 9]
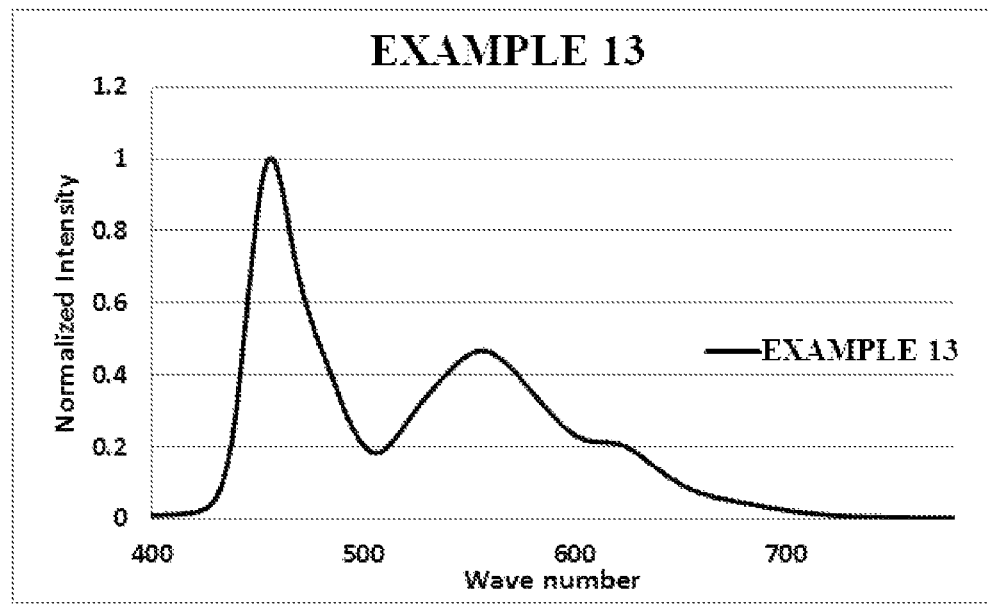

ORGANIC LIGHT-EMITTING DEVICE

CROSS-REFERENCE TO RELATED APPLICATIONS

This application is a National Stage Application of International Application No. PCT/KR2019/007644 filed on Jun. 25, 2019, which claims priority to and the benefit of Korean Patent Application No. 10-2018-0084113 filed in the Korean Intellectual Property Office on Jul. 19, 2018, the entire contents of which are incorporated herein by reference.

TECHNICAL FIELD

The present invention relates to an organic light emitting device.

BACKGROUND

As interests and demands for the field of display have been rapidly increased, display devices have been required to become thinner and lighter, and particularly, as display devices have been thinner and lighter, display devices with low power consumption and long lifetime have been developed.

Among the display devices, an organic light emitting device has attracted attention because the organic light emitting device has low power consumption and can become thinner.

The organic light emitting device has a structure in which an organic thin film is disposed between two electrodes. When a voltage is applied to an organic light emitting device having such a structure, electrons and holes injected from the two electrodes are combined with each other in an organic thin film to make a pair, and then the paired electrons and holes emit light while being annihilated. The organic thin film can be composed of a single layer or multi layers, if necessary, and can also be composed of a structure of a single light emitting unit including one light emitting layer, but recently, a lot of organic light emitting devices each having a multi stack structure including a plurality of light emitting layers have been developed.

However, an organic light emitting device having a multi stack structure includes a blue light emitting layer, and there is a problem in that the blue light emitting layer has a short lifetime, which also affects the lifetime of the entire device.

Further, since a long-wavelength light emitting layer other than the blue light emitting layer usually uses a phosphorescent light emitting material, the efficiency is relatively high, so that there is a problem in that the relatively high efficiency becomes an obstacle to producing a high-purity white light or a desired color purity.

BRIEF DESCRIPTION OF INVENTION

Technical Problem

The present invention provides an organic light emitting device having excellent efficiency and a long lifetime characteristic.

Technical Solution

The present invention provides an organic light emitting device including: an anode; a cathode provided to face the anode; two or more light emitting layers provided between the anode and the cathode and each having a maximum light emission peak at a wavelength of 500 nm or less; and a light emitting layer provided between the two or more light emitting layers each having a maximum light emission peak at a wavelength of 500 nm or less, and having a maximum light emission peak at a wavelength of more than 500 nm, in which a distance from the anode to the light emitting layer having a maximum light emission peak at a wavelength of 500 nm or less, which is the most adjacent to the anode, is 100 nm to 200 nm, a distance from the anode to the light emitting layer having a maximum light emission peak at a wavelength of 500 nm or less, which is the most adjacent to the cathode, is 3 times to 4 times the distance from the anode to the light emitting layer having a maximum light emission peak at a wavelength of 500 nm or less, which is the most adjacent to the anode, an N-type charge generation layer and a P-type charge generation layer are provided between each of the light emitting layers each having a maximum light emission peak at a wavelength of 500 nm or less and the light emitting layer having a maximum light emission peak at a wavelength of more than 500 nm, the N-type charge generation layer includes an alkali metal, and the P-type charge generation layer includes a material having an electron affinity of 4.8 eV or more.

Advantageous Effects

The organic light emitting device of the present invention includes: two or more light emitting layers provided between an anode and a cathode and each having a maximum light emission peak at a wavelength of 500 nm or less; and a light emitting layer provided between the two or more light emitting layers each having a maximum light emission peak at a wavelength of 500 nm or less, and having a maximum light emission peak at a wavelength of more than 500 nm, in which a distance from the anode to the light emitting layer having a maximum light emission peak at a wavelength of 500 nm or less, which is the most adjacent to the anode, is 100 nm to 200 nm, a distance from the anode to the light emitting layer having a maximum light emission peak at a wavelength of 500 nm or less, which is the most adjacent to the cathode, is formed so as to be 3 times to 4 times the distance from the anode to the light emitting layer having a maximum light emission peak at a wavelength of 500 nm or less, which is the most adjacent to the anode, an N-type charge generation layer and a P-type charge generation layer are provided between each of the light emitting layers each having a maximum light emission peak at a wavelength of 500 nm or less and the light emitting layer having a maximum light emission peak at a wavelength of more than 500 nm, the N-type charge generation layer includes an alkali metal, and the P-type charge generation layer includes a material having an electron affinity of 4.8 eV or more, and as a result, the organic light emitting device of the present invention has a low driving voltage, excellent efficiency, and a long lifetime characteristic.

Further, when a device is configured as described above, the efficiency of blue light emission is increased as compared to that of a long-wavelength light emission, and the electric stress imposed on the blue light emitting layer is relatively reduced, and as a result, the lifetime is improved, and white light with high purity is advantageously made by increasing the blue light emission efficiency. The white light with high purity has an advantage in producing light with a broad color range and good color purity in a general display driving method of producing a desired color by combining light passing through a color filter.

BRIEF DESCRIPTION OF DRAWINGS

FIG. 1 is a view illustrating an organic light emitting device according to an exemplary embodiment of the present invention.

FIG. 2 is a view illustrating a wavelength-peak intensity of an organic light emitting device manufactured in Comparative Example 1.

FIG. 3 is a view illustrating a wavelength-peak intensity of an organic light emitting device manufactured in Comparative Example 2.

FIG. 4 is a view illustrating a wavelength-peak intensity of an organic light emitting device manufactured in Comparative Example 3.

FIG. 5 is a view illustrating a wavelength-peak intensity of an organic light emitting device manufactured in Comparative Example 4.

FIG. 6 is a view illustrating a wavelength-peak intensity of an organic light emitting device manufactured in Example 1.

FIG. 7 is a view illustrating a wavelength-peak intensity of an organic light emitting device manufactured in Example 4.

FIG. 8 is a view illustrating a wavelength-peak intensity of an organic light emitting device manufactured in Example 5.

FIG. 9 is a view illustrating a wavelength-peak intensity of an organic light emitting device manufactured in Example 13.

EXPLANATION OF REFERENCE NUMERALS AND SYMBOLS

101: Third stack
102: Second stack
103: First stack
1: Cathode
2: Anode
11: Third electron transport layer
12: Third light emitting layer
13: Third hole transport layer
21: Second P-type charge generation layer
22: Second N-type charge generation layer
31: Second electron transport layer
32: Second light emitting layer
33: Second hole transport layer
23: First P-type charge generation layer
24: First N-type charge generation layer
41: First electron transport layer
42: First light emitting layer

DETAILED DESCRIPTION

Hereinafter, the present invention will be described in more detail.

An organic light emitting device of the present invention is characterized by including: two or more light emitting layers provided between an anode and a cathode and each having a maximum light emission peak at a wavelength of 500 nm or less; and a light emitting layer provided between the two or more light emitting layers each having a maximum light emission peak at a wavelength of 500 nm or less and having a maximum light emission peak at a wavelength of more than 500 nm, in which a distance from the anode to the light emitting layer having a maximum light emission peak at a wavelength of 500 nm or less, which is the most adjacent to the anode, is 100 nm to 200 nm, a distance from the anode to the light emitting layer having a maximum light emission peak at a wavelength of 500 nm or less, which is the most adjacent to the cathode, is 3 times to 4 times the distance from the anode to the light emitting layer having a maximum light emission peak at a wavelength of 500 nm or less, which is the most adjacent to the anode, an N-type charge generation layer and a P-type charge generation layer are provided between each of the light emitting layers each having a maximum light emission peak at a wavelength of 500 nm or less and the light emitting layer having a maximum light emission peak at a wavelength of more than 500 nm, the N-type charge generation layer includes an alkali metal, and the P-type charge generation layer includes a material having an electron affinity of 4.8 eV or more.

When one part "includes" one constituent element in the present specification, unless otherwise specifically described, this does not mean that another constituent element is excluded, but means that another constituent element can be further included.

When one member is disposed "on" another member in the present specification, this includes not only a case where the one member is in contact with another member, but also a case where still another member is present between the two members.

The structure of the organic light emitting device according to an exemplary embodiment of the present invention can have a structure illustrated in FIG. 1, but is not limited thereto. The organic light emitting device illustrated in FIG. 1 includes: on an anode 2, a first stack 103 in which a first hole transport layer 43, a first light emitting layer 42, and a first electron transport layer 41 are stacked in this order; a first N-type charge generation layer 24; a first P-type charge generation layer 23; a second stack 102 in which a second hole transport layer 33, a second light emitting layer 32, and a second electron transport layer 31 are stacked in this order; a second N-type charge generation layer 22; a second P-type charge generation layer 21; a third stack 101 in which a third hole transport layer 13, a third light emitting layer 12, and a third electron transport layer 11 are stacked in this order; and a cathode 1.

In the organic light emitting device of the present invention, a distance from an anode to a light emitting layer having a maximum light emission peak at a wavelength of 500 nm or less, which is the most adjacent to the anode, can be 100 nm to 200 nm, and a distance from the anode to the light emitting layer having a maximum light emission peak at a wavelength of 500 nm or less, which is the most adjacent to the cathode, can be 3 times to 4 times, preferably 3 times to 3.8 times the distance from the anode to the light emitting layer having a maximum light emission peak at a wavelength of 500 nm or less, which is the most adjacent to the anode. When the distance satisfies the above range, the efficiency of the device is excellent, the lifetime thereof is improved, and the color coordinate is lowered due to the high peak intensity.

According to an exemplary embodiment of the present invention, the organic light emitting device can include: two light emitting layers provided between an anode and a cathode and each having a maximum light emission peak at a wavelength of 500 nm or less; and a light emitting layer provided between the two light emitting layers each having a maximum light emission peak at a wavelength of 500 nm or less, and having a maximum light emission peak at a wavelength of more than 500 nm. When there are three or more light emitting layers each having a maximum light emission peak at a wavelength of 500 nm or less between an anode and a cathode in the organic light emitting device, a material included in the light emitting layer having a maximum light emission peak at a wavelength of 500 nm or less has a large bandgap, thereby increasing the driving voltage of the device and the power consumption. Accordingly, when there are two light emitting layers each having a maximum light emission peak at a wavelength of 500 nm or less between an anode and a cathode, it is possible to obtain an organic light emitting device having a lower driving voltage and lower power consumption than those of an organic light emitting device in which there are three light emitting layers each having a maximum light emission peak at a wavelength of 500 nm or less between the anode and the cathode.

As described above, in the organic light emitting device of the present invention, a distance from an anode to a light emitting layer having a maximum light emission peak at a wavelength of 500 nm or less, which is the most adjacent to the anode, is 100 nm to 200 nm. A distance from an anode to a light emitting layer having a maximum light emission peak at a wavelength of 500 nm or less, which is the most adjacent to the cathode, is 3 times to 4 times the distance from the anode to the light emitting layer having a maximum light emission peak at a wavelength of 500 nm, which is the most adjacent to the anode.

In this case, the distance from the anode to the light emitting layer having a maximum light emission peak at a wavelength of 500 nm or less, which is the most adjacent to the anode, means a distance from an interface between an anode and an adjacent layer to an interface between a light emitting layer having a maximum light emission peak at a wavelength of 500 nm or less, which is the most adjacent to the anode, and a layer which is adjacent to the side of the anode.

Further, the distance from the anode to the light emitting layer having a maximum light emission peak at a wavelength of 500 nm or less, which is the most adjacent to the cathode, means a distance from an interface at which an anode is in contact with an adjacent layer to an interface between a light emitting layer having a maximum light emission peak at a wavelength of 500 nm or less, which is the most adjacent to the cathode, and a layer which is adjacent to the side of the anode.

In the manufactured organic light emitting device, it is possible to measure the distance from the anode to the light emitting layer having a maximum light emission peak at a wavelength of 500 nm or less, which is the most adjacent to the anode, and the distance from the anode to the light emitting layer having a maximum light emission peak at a wavelength of 500 nm or less, which is the most adjacent to the cathode, using a TOF-SIMS measurement apparatus. Specifically, TOF-SIMS is a surface analysis apparatus which can obtain information on atoms present on the surface of a material and the structural arrangement thereof by analyzing the masses of ionized particles emitted from the surface of the material as a primary ion ($Binm^+$, $O_2^+$, $Cs^+$, $Ar_n^+$) having energy of several keV collides with the surface of the material. TOF-SIMS can analyze the types of elements and molecules constituting the compositions of the surface, interface, and inside of the material and perform the trace (ppm) analysis on the surface, and thus is very useful for studies on impurities, and can measure the component of the material according to the depth while adjusting the intensity of ions and performing depth profiling, thereby measuring the distance between the respective layers by comparing the component of the material with information on a material corresponding to each layer at a specific depth.

The light emitting layer having a maximum light emission peak at a wavelength of 500 nm or less can be a blue light emitting layer, and can be formed of a single layer or multiple layers.

The light emitting layer having a maximum light emission peak at a wavelength of more than 500 nm can be formed of a single layer or multiple layers, when formed of the single layer, the light emitting layer can be a red light emitting layer or a yellow-green light emitting layer, and when the light emitting layer is formed of multiple layers, each layer can be a red light emitting layer or a yellow-green light emitting layer.

An N-type charge generation layer and a P-type charge generation layer are provided between each of the light emitting layers each having a maximum light emission peak at a wavelength of 500 nm or less and the light emitting layer having a maximum light emission peak at a wavelength of more than 500 nm.

The N-type charge generation layers 22 and 24 each generate electrons and holes and can be formed between a first electron transport layer and a first P-type charge generation layer, and between a second electron transport layer and a second N-type charge generation layer.

The thicknesses of the N-type charge generation layers 22 and 24 can be each 50 Å to 300 Å, preferably 50 Å to 250 Å, the N-type charge generation layer includes an alkali metal, a compound such as a carbazole derivative and a pyrimidine derivative can be used together with the alkali metal, and the alkali metal can be included in an amount of 1 part by weight to 5 parts by weight based on the total 100 parts by weight of the N-type charge generation layer.

The P-type charge generation layers 21 and 23 each generate electrons and holes, and can be formed between a second hole transport layer and a first N-type charge generation layer, and between a third hole transport layer and a second N-type charge generation layer.

The thicknesses of the P-type charge generation layers 21 and 23 can be each 50 Å to 300 Å, preferably 50 Å to 250 Å.

As described above, it is preferred that the thickness of each of the N-type charge generation layers 22 and 24 and the P-type charge generation layers 21 and 23 is 50 Å or more, and 50 Å or more and 300 Å or less. When the thickness of each of the N-type charge generation layers 22 and 24 and the P-type charge generation layers 21 and 23 satisfies the above range, there is an effect in that the entire driving voltage of the device is lowered due to the excellent charge conductivity, and when the thickness of each of the N-type charge generation layers 22 and 24 and the P-type charge generation layers 21 and 23 is less than 50 Å, there is a problem in that the role as the charge generation layer cannot be effectively exhibited.

Examples of a material for forming the P-type charge generation layer includes a material having an electron affinity of 4.8 eV or more, preferably 5 eV or more. When a material having an electron affinity of 4.8 eV or more is included in the P-type charge generation layer, there is an advantage in that the driving voltage of the device is lowered, and the efficiency and lifetime thereof are increased. In addition, in the P-type charge generation layer, an organic material such as a carbazole derivative and an amine derivative can be included in a mixture with the material having an electron affinity of 4.8 eV or more. In this case, the material to be mixed can be included in an amount of 0.01 part by weight to 10 parts by weight, preferably 0.01 part by weight to 5 parts by weight, based on 100 parts by weight of the material having an electron affinity of 4.8 eV or more.

In the present specification, the electron affinity means energy emitted when a compound combines with electrons to become negative ions, and can be measured by a method used in the art, such as a photoemission method, a movement method, and an electron transmission method.

In accordance with the experimental measurement method in the present specification, the electron affinity (EA) through the quantum role can be calculated using the following Equation:

$$EA(\text{electron affinity}) = E_{neutral}^{X} - E_{anion}^{X-} \qquad <\text{Equation}>$$

In the equation, $E_{geometry}^{charge}$ means energy in which a charge is 0, $X^+$, or $X^-$ in a structure where geometry is optimized with a cation, an anion or a neutral charge. That is, the electron affinity means the difference between the safest energy of an anion and the energy with the safest structure of a neutral structure, and can mean energy emitted when one electron is added in a neutral state.

Specifically, for the value of the equation, a structure stable for each of a neutral structure with an electron valence of 0 and a cation with an electron valence of −1 was obtained, and the electron affinity was obtained according to the equation after the calculation of the energy. The optimization of structure and the calculation of energy were carried out by a density functional theory (DFT) using the BPW91 function and dnd basis function through Dmol3, a quantum chemistry calculation program by Accelrys, US.

In the organic light emitting device of the present invention, the intensity of the maximum light emission peak at a wavelength of 500 nm or less is 1.5 times or more, preferably 2 times or more and 3.5 times or less the intensity of the maximum light emission peak at a wavelength of more than 500 nm in the entire light emitting spectrum of the organic light emitting device, and when the intensity of the maximum light emission peak satisfies the above range, the light emission at a wavelength of 500 nm or less, which has a relatively short lifetime, and the light emission at a wavelength of more than 500 nm, which has a relatively long lifetime, are in balance, so that there is an advantage in that the lifetime of the device is increased.

In the organic light emitting device of the present invention, an electron transport layer is provided at the cathode side of each of the light emitting layers, and a hole transport layer is provided at the anode side of each of the light emitting layers.

Among the hole transport layers, a hole transport layer which is the most adjacent to the anode can be in contact with the anode, and among the electron transport layers, an electron transport layer which is the most adjacent to the cathode can be in contact with the cathode.

Furthermore, a hole transport layer which is the most adjacent to the anode among the hole transport layers is in contact with the anode, an electron transport layer which is the most adjacent to the cathode among the electron transport layers is in contact with the cathode, and the hole transport layer which is the most adjacent to the anode or the electron transport layer which is the most adjacent to the cathode can include two or more materials. In this case, there is an advantage in that the driving voltage of the device is lowered, and the lifetime thereof is increased.

A hole transport layer which is the most adjacent to the anode among the hole transport layers is in contact with the anode, an electron transport layer which is the most adjacent to the cathode among the electron transport layers is in contact with the cathode, and the hole transport layer which is the most adjacent to the anode and the electron transport layer which is the most adjacent to the cathode can include two or more materials. In this case, there is an advantage in that the driving voltage of the device is lowered, and the lifetime thereof is increased.

In the organic light emitting device of the present invention, the light emitting layers each having a maximum light emission peak at a wavelength of 500 nm or less are each composed of two or more layers, or each includes two or more host materials. In this case, there is an advantage in that the lifetime of the device is increased.

In the organic light emitting device of the present invention, the light emitting layer having a maximum light emission peak at a wavelength of more than 500 nm is composed of two or more layers, and one or more layers of the two or more layers includes two or more hosts. In this case, there is an advantage in that the efficiency and lifetime of the device are increased.

In the present invention, the anode is an electrode which injects holes, and as an anode material, a material having a large work function is preferred so as to facilitate injection of holes into an organic material layer. Specific examples of the anode material include: a metal, such as vanadium, chromium, copper, zinc, and gold, or an alloy thereof; a metal oxide, such as zinc oxide, indium oxide, indium tin oxide (ITO), and indium zinc oxide (IZO); a combination of metal and oxide, such as ZnO:Al or $SnO_2$:Sb; a conductive polymer, such as poly(3-methylthiophene), poly[3,4-(ethylene-1,2-dioxy)-thiophene] (PEDOT), polypyrrole, and polyaniline; and the like, but are not limited thereto. The anode can be formed to have a thickness of 1,000 Å to 2,000 Å, but the thickness is not limited thereto.

In the present invention, the cathode is an electrode which injects electrons, and as cathode material, a material having a low work function is preferred so as to facilitate injection of electrons into an organic material layer. Specific examples of the cathode material include: a metal, such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto. The cathode can be formed to have a thickness of 1,000 Å to 2,000 Å, but the thickness is not limited thereto.

In the present invention, the hole transport layer is a layer which serves to smoothly transport holes, and as a hole transport layer material, a material having high mobility for a positive electrode or a hole is suitable. Specific examples of the hole transport layer material include arylamine-based organic materials, conductive polymers, block copolymers having both conjugated portions and non-conjugated portions, and the like, but are not limited thereto. The hole transport layer can be formed to have a thickness of 10 Å to 2,000 Å, but the thickness is not limited thereto.

In the present invention, the electron transport layer is a layer which serves to smoothly transport electrons, and an electron transport layer material is suitably a material having high electron mobility, which can proficiently accept electrons from a negative electrode and transfer the electrons to a light emitting layer. Specific examples of the electron transport layer material include arylamine-based organic materials, carbazole-based organic materials, anthracene-based organic materials, and the like, but are not limited thereto, and the electron transport layer can include two or more materials. The electron transport layer can be formed to have a thickness of 10 Å to 1,000 Å, but the thickness is not limited thereto.

In the present invention, the light emitting layer can emit blue, green and red light, and can be composed of a phosphorescent material or a fluorescent material, and the light emitting layer includes a host and a dopant.

Examples of the host of the light emitting layer include fused aromatic ring derivatives, or hetero ring-containing compounds, and the like. Specifically, examples of the fused aromatic ring derivatives include an anthracene derivative, a pyrene derivative, a naphthalene derivative, a pentacene derivative, a phenanthrene compound, a fluoranthene compound, and the like, and examples of the hetero ring-containing compounds include a carbazole derivative, a dibenzofuran derivative, a ladder-type furan compound, a pyrimidine derivative, and the like, but the examples thereof are not limited thereto.

When the light emitting layer emits red light, it is possible to use, as a light emitting dopant, a material such as bis(1-phenylisoquinoline)-acetyl-acetonate iridium (PIQIr (acac)), bis(1-phenyl-quinoline)acetylacetonate iridium (PQIr(acac)), tris(1-phenylquinoline) iridium (PQIr), or octaethyl-porphyrin platinum (PtOEP), or a material such as tris(8-hydroxy-quinolino)aluminum ($Alq_3$), but the light emitting dopant is not limited thereto. When the light emitting layer emits green light or yellow-green light, it is possible to use, as the light emitting dopant, a material such as fac-tris(2-phenylpyridine)-iridium ($Ir(ppy)_3$), or a material such as tris(8-hydroxyquinolino)aluminum ($Alq_3$), but the light emitting dopant is not limited thereto. When the light emitting layer emits blue light, it is possible to use, as the light emitting dopant, a material such as $(4,6-F_2ppy)_2Irpic$, or a material such as spiro-DPVBi, spiro-6P, distyrylbenzene (DSB), distyrylarylene (DSA), a pyrene derivative, a PFO-based polymer or a PPV-based polymer, but the light emitting dopant is not limited thereto.

The organic light emitting device of the present invention can be manufactured by typical manufacturing methods and materials of an organic light emitting device.

A compound can be formed as an organic material layer by not only a vacuum deposition method, but also a solution application method when the organic light emitting device is manufactured. Here, the solution application method means spin coating, dip coating, inkjet printing, screen printing, a spray method, roll coating, and the like, but is not limited thereto.

The organic light emitting device according to the present invention can be a top emission type, a bottom emission type, or a dual emission type according to the material to be used.

EXAMPLES

Examples/Comparative Examples

Organic light emitting devices of Examples 1 to 13 and Comparative Examples 1 to 6, in which ITO (1,500 Å)/a first stack/a first charge generation layer/a second stack/a second charge generation layer/a third stack/LiF (10 Å)/Al (1,000 Å) are stacked in this order by using the materials described in the following Tables 1 to 4, were manufactured.

TABLE 1

| | Anode | First stack | | | 1st charge generation layer | | Second stack | | | 2nd charge generation layer | | Third stack | | | Cathode |
|---|---|---|---|---|---|---|---|---|---|---|---|---|---|---|---|
| | | 1st HTL | 1st EML | 1st ETL | 1st N-CGL | 1st P-CGL | 2nd HTL | 2nd EML | 2nd ETL | 2nd N-CGL | 2nd P-CGL | 3rd HTL | 3rd EML | 3rd ETL | |
| Comparative Example 1 | 170 (1500 Å) | HT-1 | EMB-1 | — | — | — | — | EMYG-1 | — | — | — | — | — | ET-3 | LiF (10 Å)/ Al (1000 Å) |
| Comparative Example 2 | | HT-1 | EMB-1 | ET-1 | N-1 | P-1 | HT-2 | EMYG-1 | — | — | — | — | — | ET-3 | |
| Comparative Example 3 | | HT-1 | EMB-1 | ET-1 | N-1 | P-1 | HT-2 | EMYG-1 | ET-2 | N-1 | P-1 | HT-7 | EMB-1 | ET-3 | |
| Comparative Example 4 | | HT-1 | EMB-1 | ET-1 | N-1 | P-1 | HT-2 | EMYG-1 | ET-2 | N-1 | P-1 | HT-6 | EMB-1 | ET-3 | |
| Comparative Example 5 | | HT-1 | EMB-1 | ET-1 | N-1 | P-3 | HT-2 | EMYG-1 | ET-2 | N-1 | P-4 | HT-3 | EMB-1 | ET-3 | |
| Comparative Example 6 | | HT-1 | EMB-1 | ET-1 | N-2 | P-1 | HT-2 | EMYG-1 | ET-2 | N-2 | P-1 | HT-3 | EMB-1 | ET-3 | |
| Example 1 | | HT-1 | EMB-1 | ET-1 | N-1 | P-1 | HT-2 | EMYG-1 | ET-2 | N-1 | P-1 | HT-3 | EMB-1 | ET-3 | |
| Example 2 | | HT-4 | EMB-1 | ET-1 | N-1 | P-1 | HT-2 | EMYG-1 | ET-2 | N-1 | P-1 | HT-5 | EMB-1 | ET-3 | |
| Example 3 | | HT-6 | EMB-1 | ET-1 | N-1 | P-1 | HT-2 | EMYG-1 | ET-2 | N-1 | P-1 | HT-5 | EMB-1 | ET-3 | |
| Example 4 | | HT-1 | EMB-1 | ET-1 | N-1 | P-1 | HT-2 | EMYG-1 | ET-2 | N-1 | P-1 | HT-10 | EMB-1 | ET-3 | |
| Example 5 | | HT-1 | EMB-1 | ET-1 | N-1 | P-1 | HT-2 | EMYG-1 | ET-2 | N-1 | P-1 | HT-1 | EMB-1 | ET-3 | |
| Example 6 | | HT-1 | EMB-1 | ET-1 | N-1 | P-2 | HT-2 | EMYG-1 | ET-2 | N-1 | P-2 | HT-3 | EMB-1 | ET-3 | |
| Example 7 | | HT-1 | EMB-1 | ET-1 | N-1 | P-1 | HT-2 | EMYG-1 | ET-2 | N-1 | P-1 | HT-3 | EMB-1 | ET-3 | |
| Example 8 | | HT-1 | EMB-1 | ET-1 | N-1 | P-1 | HT-9 | EMYG-1 | ET-2 | N-1 | P-1 | HT-3 | EMB-1 | ET-3 | |
| Example 9 | | HT-1 | EMB-2 | ET-1 | N-1 | P-1 | HT-2 | EMYG-1 | ET-2 | N-1 | P-1 | HT-3 | EMB-2 | ET-3 | |
| Example 10 | | HT-1 | EMB-2 | ET-1 | N-1 | P-1 | HT-2 | EMYG-1 | ET-2 | N-1 | P-1 | HT-3 | EMB-3 | ET-3 | |
| Example 11 | | HT-1 | EMB-3 | ET-1 | N-1 | P-1 | HT-2 | EMYG-1 | ET-2 | N-1 | P-1 | HT-3 | EMB-3 | ET-3 | |
| Example 12 | | HT-6 | EMB-1 | ET-1 | N-1 | P-1 | HT-2 | EMYG-1 | ET-2 | N-1 | P-1 | HT-5 | EMB-1 | ET-4 | |
| Example 13 | | HT-6 | EMB-2 | ET-1 | N-1 | P-1 | HT-9 | EMYG-2 | ET-2 | N-1 | P-1 | HT-5 | EMB-3 | ET-4 | |

*HTL: Hole transport layer/EML: Light emitting layer/N-CGL: N-type charge generation layer/P-CGL: P-type charge generation layer

TABLE 2

| | |
|---|---|
| HT-1 | HTL1 (1000 Å) |
| HT-2 | HTL2 (300 Å) |
| HT-3 | HTL1 (800 Å) |
| HT-4 | HTL1 (100 Å)/HTL2 (900 Å) |
| HT-5 | HTL1 (100 Å)/HTL2 (700 Å) |
| HT-6 | HTL1 (100 Å) + P-CGL1 (3 wt %)/ HTL1 (400 Å) + HTL2 (400 Å)/HTL2 (100 Å) |
| HT-7 | HTL1 (100 Å) |
| HT-8 | HTL1 (1400 Å) |
| HT-9 | HTL2 (100 Å) |
| HT-10 | HTL1 (300 Å) |

TABLE 3

| | |
|---|---|
| N-1 | ETU (200 Å) + Li (2 wt %) |
| N-2 | ETL1 (200 Å) |
| P-1 | HTL1 (100 Å) + P-CGL2 (3 wt %) |
| P-2 | P-CGL1 (100 Å) |
| P-3 | P-CGL3 (100 Å) |
| P-4 | HTL1 (100 Å) + P-CGL3 (3 wt %) |
| ET-1 | ETL1 (100 Å) |
| ET-2 | ETL1 (250 Å) |
| ET-3 | ETL1 (300 Å) |
| ET-4 | ETL1 (150 Å) + ETL2 (150 Å) |

TABLE 4

| | |
|---|---|
| EMB-1 | BH1 (200 Å) + BD1 (3 wt %) |
| EMB-2 | BH1 (100 Å) + BH2 (100 Å) + BD1 (3 wt %) |
| EMB-3 | BH1 (100 Å) + BD1 (3 wt %)/BH2 (100 Å) BD1 (3 wt %) |
| EMYG-1 | YGH1 (300 Å) + YGD1 (3 wt %) |
| EMRYG-1 | RH1 (100 Å) + RD1 (5 wt %)/<br>YGH1 (200 Å) + YGD1 (10 wt %)/<br>BH (200 Å) + GD1 (10 wt %) |
| EMRYG-2 | RH1 (50 Å) + HTL2 (50 Å) + RD1 (5 wt %)/<br>YGH1 (100 Å) + YGH2 (100 Å) + YGD1 (10 wt %)/<br>YGH1 (100 Å) + YGH2 (100 Å) + GD1 (10 wt %) |

[HTL1]

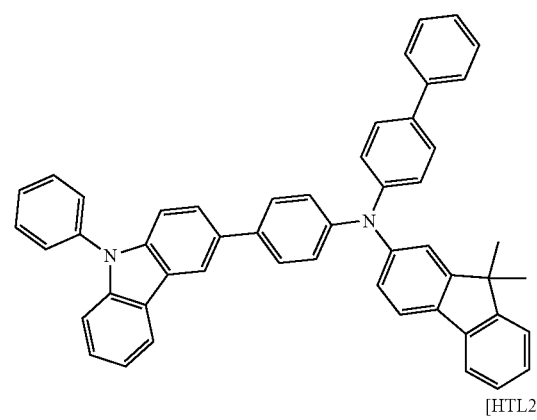

[HTL2]

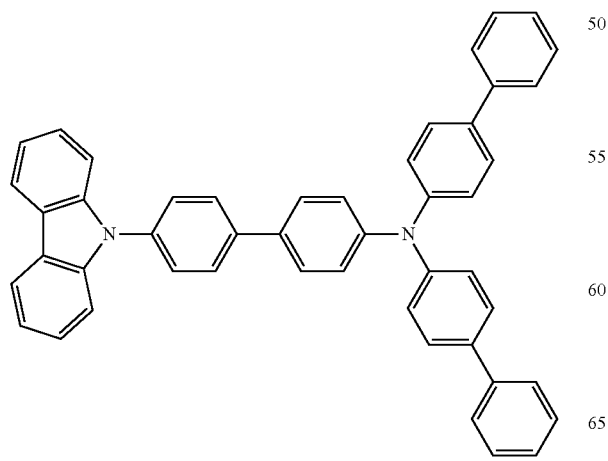

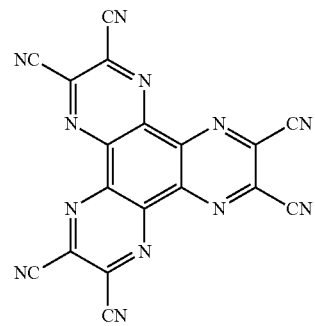

[P-CGL1 (Electron affinity: 5.2 eV)]

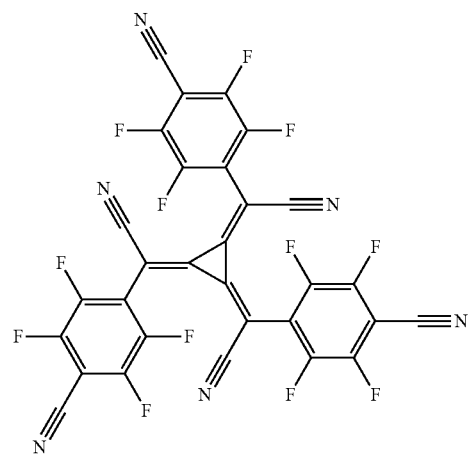

[P-CGL2 (Electron affinity: 5.0 eV)]

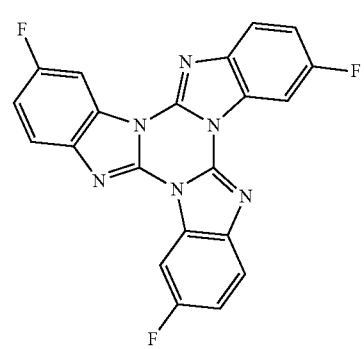

[P-CGL3 (Electron affinity: 2.0 eV)]

[EBL1]
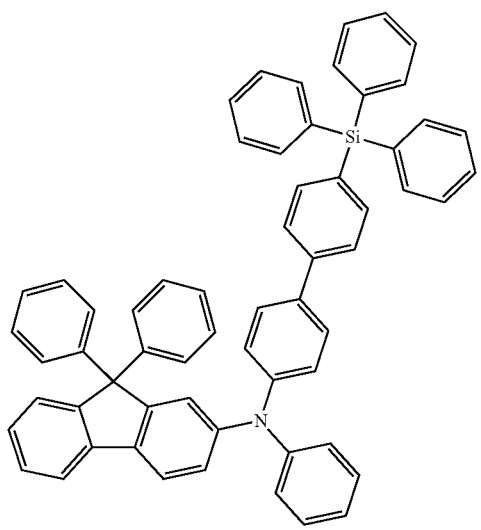
[ETL1]
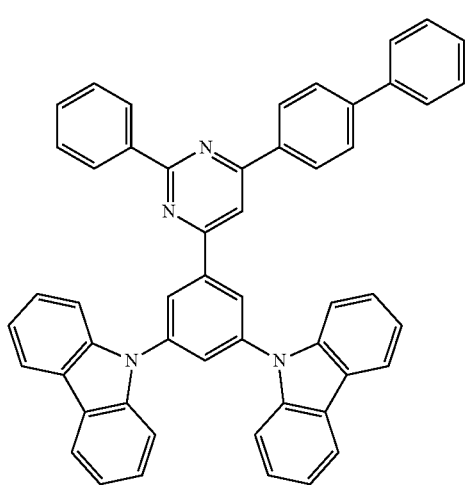
[ETL2]
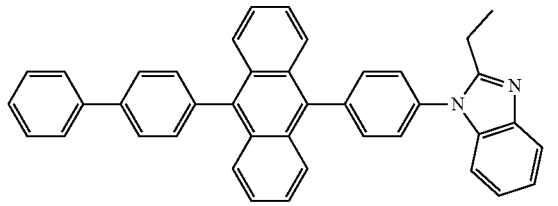
[BH1]
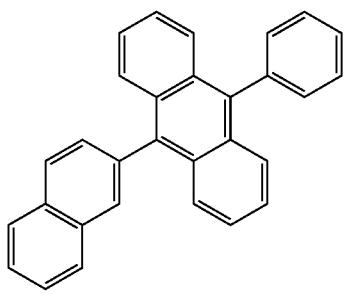
[BH2]
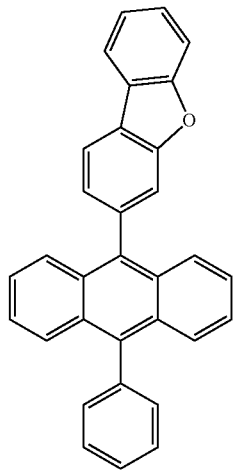
[BD1]
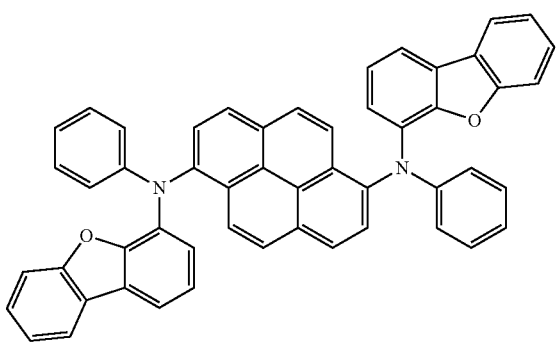
[RH1]
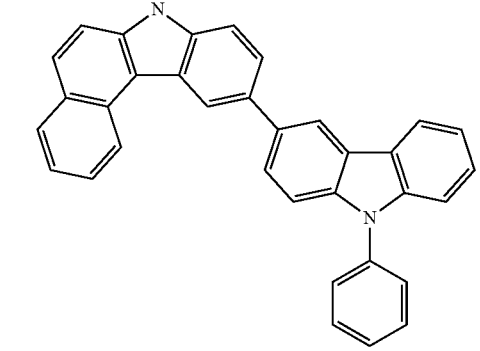

[YGH1]
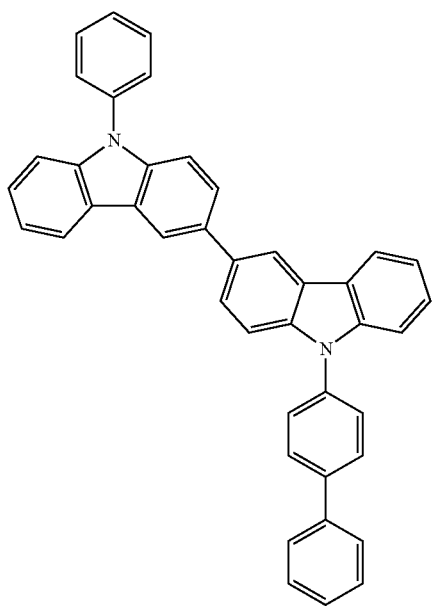
[YGH2]
[RD1]
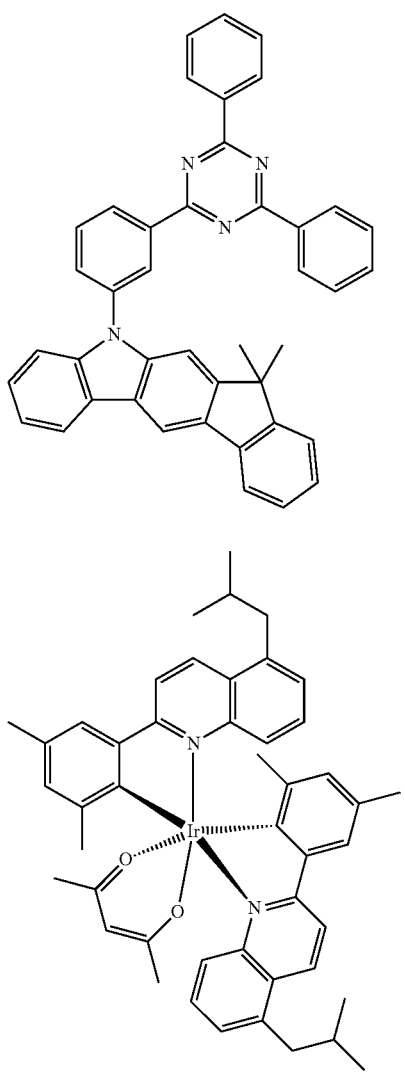
[YGD1]
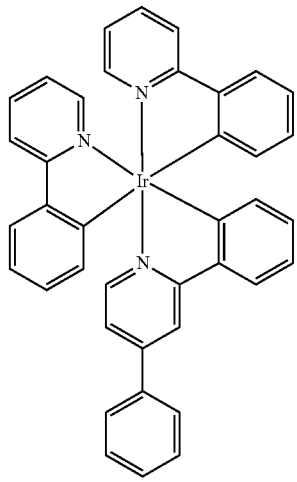
[GD1]
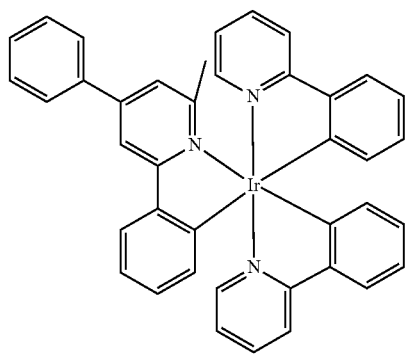
The results of measuring the device performances of the organic light emitting devices manufactured in Examples 1 to 13 and Comparative Examples 1 to 6 are shown in the following Table 5.

TABLE 5

|  | Vop | mA/cm² | Cd/A | CIE-x | CIE-y | Life-Time(@90%) | D(3rd B)/D(1st B) | I(SW)/I(LW) |
|---|---|---|---|---|---|---|---|---|
| Comparative Example 1 | 5.3 | 10 | 66.2 | 0.402 | 0.452 | 183 | — | 0.37 |
| Comparative Example 2 | 7.4 | 10 | 61.8 | 0.380 | 0.416 | 301 | — | 0.55 |
| Comparative Example 3 | 9 | 10 | 64.0 | 0.292 | 0.313 | 533 | 2.85 | 1.57 |
| Comparative Example 4 | 13.8 | 10 | 64.2 | 0.297 | 0.522 | 490 | 4.15 | 1.45 |
| Comparative Example 5 | 14.9 | 10 | 61.4 | 0.252 | 0.272 | 402 | 3.55 | 2.21 |
| Comparative Example 6 | 17.6 | 10 | 50.7 | 0.236 | 0.234 | 318 | 3.55 | 3.33 |
| Example 1 | 10.8 | 10 | 76.3 | 0.249 | 0.273 | 770 | 3.55 | 2.34 |
| Example 2 | 10.4 | 10 | 76.4 | 0.249 | 0.274 | 784 | 3.55 | 2.33 |
| Example 3 | 9.8 | 10 | 76.6 | 0.249 | 0.274 | 812 | 3.55 | 2.34 |
| Example 4 | 9.9 | 10 | 81.7 | 0.254 | 0.282 | 725 | 3.05 | 2.19 |
| Example 5 | 11.0 | 10 | 81.6 | 0.261 | 0.296 | 731 | 3.75 | 2.00 |
| Example 6 | 11.3 | 10 | 74.6 | 0.270 | 0.300 | 759 | 3.55 | 1.94 |
| Example 7 | 11.6 | 10 | 70.6 | 0.256 | 0.254 | 774 | 3.55 | 3.40 |
| Example 8 | 11.7 | 10 | 76.4 | 0.272 | 0.271 | 791 | 3.55 | 3.24 |
| Example 9 | 11.4 | 10 | 73.4 | 0.261 | 0.280 | 796 | 3.55 | 3.39 |
| Example 10 | 11.3 | 10 | 73.5 | 0.263 | 0.263 | 813 | 3.55 | 3.24 |
| Example 11 | 11.3 | 10 | 75.2 | 0.270 | 0.269 | 609 | 3.55 | 3.21 |
| Example 12 | 11.7 | 10 | 75.4 | 0.272 | 0.271 | 763 | 3.55 | 2.92 |
| Example 13 | 11.6 | 10 | 78.9 | 0.276 | 0.295 | 837 | 3.55 | 2.16 |

\* $D(3^{rd} B)$: Distance from an anode to a light emitting layer having a maximum light emission peak at a wavelength of 500 nm or less, which is the most adjacent to a cathode \* $D(1^{st} B)$: Distance from an anode to a light emitting layer having a maximum light emission peak at a wavelength of 500 nm or less, which is the most adjacent to an anode \* I(SW): Intensity of a maximum light emission peak at a wavelength of 500 nm or less in the entire light emitting spectrum \* I(LW): Intensity of a maximum light emission peak at a wavelength of more than 500 nm in the entire light emitting spectrum \* Life-Time: Time taken for the luminescence to be reduced to 90% compared to the initial luminescence under a constant current condition of 20 mA/cm²

From Table 5, it can be confirmed that the lifetimes of the organic light emitting devices in Examples 1 to 13 of the present application are rapidly increased as compared to Comparative Examples 1 to 6.

Specifically, it can be confirmed that Comparative Examples 1 and 2 are organic light emitting devices including only one light emitting layer having a maximum light emission peak at a wavelength of 500 nm or less, and have remarkably lower current efficiencies (cd/A) and lifetimes of the devices than those of Examples 1 to 13 of the present application.

It can be confirmed that in Comparative Examples 3 and 4, the D ($3^{rd}$ B)/D ($1^{st}$ B) values are out of a range of 3 to 4, and Comparative Examples 3 and 4 have remarkably lower current efficiencies (cd/A) and lifetimes of the devices than those in Examples 1 to 13 of the present application in which the D ($3^{rd}$ B)/D ($1^{st}$ B) values satisfy the range of 3 to 4.

Further, it can be confirmed that Comparative Example 5 does not include a material having an electron affinity of 4.8 eV or more in a P-type charge generation layer, Comparative Example 6 does not include an alkali metal in an N-type charge generation layer, and Comparative Examples 5 and 6 have remarkably lower current efficiencies (cd/A) and lifetimes of the devices than those in Examples 1 to 13 of the present application.

The following FIGS. 2 to 9 illustrate the wavelength-peak intensities of Comparative Examples 1 to 4 and Examples 1, 4, 5, and 13, respectively, and it can be confirmed that in FIGS. 2 and 3 illustrating the experimental results in Comparative Examples 1 and 2, the lifetimes of the devices are shortened by the effect of the short wavelength of 500 nm or less, which has a short lifetime because the peak intensity of the long wavelength of more than 500 nm is remarkably higher than the peak intensity of the short wavelength of 500 nm or less, and in FIGS. 6 to 8 illustrating the experimental results in Examples 1, 4, and 5, the lifetimes of the devices are remarkably increased because the peak intensity of the short wavelength of 500 nm or less is 2 times or more stronger than the peak intensity of the long wavelength of more than 500 nm.

The invention claimed is:

1. An organic light emitting device comprising:
   an anode;
   a cathode provided to face the anode;
   two or more light emitting layers provided between the anode and the cathode and each having a maximum light emission peak at a wavelength of 500 nm or less; and
   a light emitting layer having a maximum light emission peak at a wavelength of more than 500 nm provided between the two or more light emitting layers each having a maximum light emission peak at a wavelength of 500 nm or less,
   wherein a distance from the anode to the light emitting layer having a maximum light emission peak at a wavelength of 500 nm or less, which is the most adjacent to the anode, is 100 nm to 200 nm,
   a distance from the anode to the light emitting layer having a maximum light emission peak at a wavelength of 500 nm or less, which is the most adjacent to the cathode, is 3 times to 4 times the distance from the anode to the light emitting layer having a maximum light emission peak at a wavelength of 500 nm or less, which is the most adjacent to the anode,
   an N-type charge generation layer and a P-type charge generation layer are provided between each of the light emitting layers each having a maximum light emission peak at a wavelength of 500 nm or less and the light emitting layer having a maximum light emission peak at a wavelength of more than 500 nm, and the N-type charge generation layer comprises an alkali metal, and the P-type charge generation layer comprises a material having an electron affinity of 4.8 eV or more, wherein the distance from the anode to the light emitting layer having a maximum light emission peak at a wavelength of 500 nm or less, which is the most adjacent to the anode means the distance from an interface between the anode and a layer which is adjacent to a side of the anode, which faces the cathode to an interface between the light emitting layer having a maximum light emission peak at 500 nm or less, which is the most adjacent to the anode, and the layer which is adjacent to the side of the anode, which faces the cathode, and wherein the distance from the anode to the light emitting layer having a maximum light emission peak at a wavelength of 500 nm or less, which is the most adjacent to the cathode means the distance from the interface between the anode and the layer which is adjacent to the side of the anode, which faces the cathode to an interface between the light emitting layer having a maximum light emission peak at a wavelength of 500 nm or less, which is the most adjacent to the cathode, and a layer which is adjacent to a side of the light emitting layer having a maximum light emission peak at a wavelength of 500 nm or less, which is the most adjacent to the cathode, which faces the anode.

2. The organic light emitting device of claim 1, wherein an intensity of the maximum light emission peak at a wavelength of 500 nm or less is 1.5 times or more an intensity of the maximum light emission peak at a wavelength of more than 500 nm in the entire light emitting spectrum of the organic light emitting device.

3. The organic light emitting device of claim 1, wherein an electron transport layer is provided at a cathode side of each the light emitting layers, and a hole transport layer is provided at an anode side of each of the light emitting layers.

4. The organic light emitting device of claim 3, wherein a hole transport layer which is the most adjacent to the anode among the hole transport layers is in contact with the anode, an electron transport layer which is the most adjacent to the cathode among the electron transport layers is in contact with the cathode, and the hole transport layer which is the most adjacent to the anode or the electron transport layer which is the most adjacent to the cathode comprises two or more materials.

5. The organic light emitting device of claim 3, wherein:
a hole transport layer which is the most adjacent to the anode among the hole transport layers is in contact with the anode;
an electron transport layer which is the most adjacent to the cathode among the electron transport layers is in contact with the cathode; and
the hole transport layer which is the most adjacent to the anode and the electron transport layer which is the most adjacent to the cathode comprise two or more materials.

6. The organic light emitting device of claim 1, wherein the light emitting layers each having a maximum light emission peak at a wavelength of 500 nm or less are each composed of two or more layers, or each comprises two or more host materials.

7. The organic light emitting device of claim 1, wherein the light emitting layer having a maximum light emission peak at a wavelength of more than 500 nm is composed of two or more layers, and one or more layers of the two or more layers comprises two or more hosts.

8. The organic light emitting device of claim 1, wherein the material having an electron affinity of 4.8 eV or more is

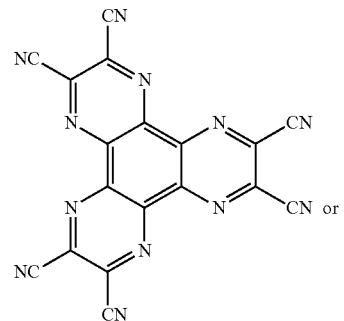

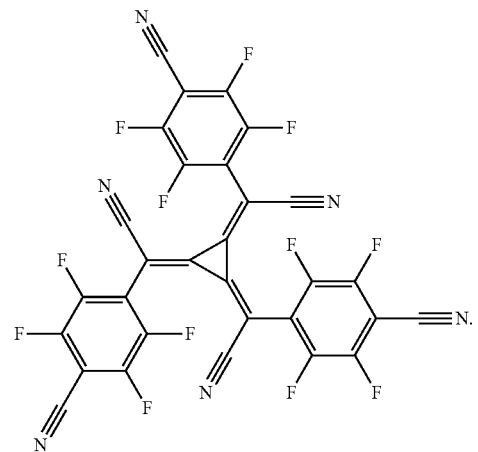

9. The organic light emitting device of claim 1, wherein the P-type charge generation layer comprises a material having an electron affinity of 4.8 eV in combination with a carbazole derivative or an amine derivative.

10. The organic light emitting device of claim 9, wherein the carbazole derivative is:

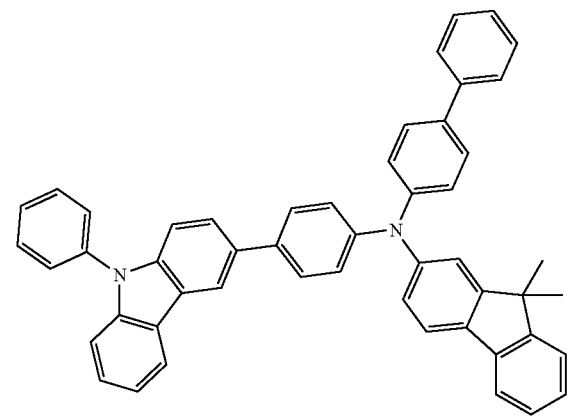 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

11. The organic light emitting device of claim 10, wherein the P-type charge generation layer comprises:

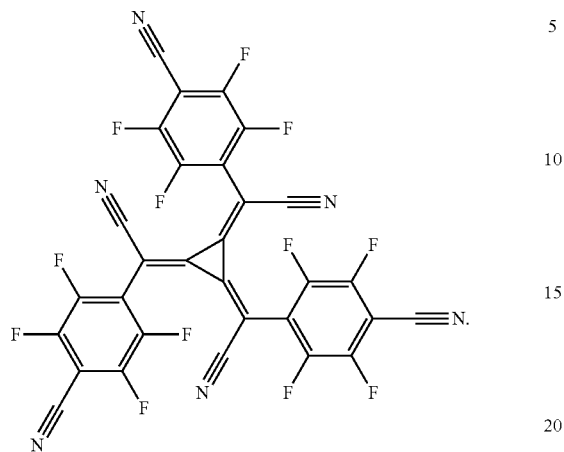

12. The organic light emitting device of claim 1, wherein an intensity of the maximum light emission peak at a wavelength of 500 nm or less is 2 times to 3.5 times an intensity of the maximum light emission peak at a wavelength of more than 500 nm in the entire light emitting spectrum of the organic light emitting device.

* * * * *